United States Patent
Rajsuman

(10) Patent No.: US 6,915,469 B2
(45) Date of Patent: Jul. 5, 2005

(54) HIGH SPEED VECTOR ACCESS METHOD FROM PATTERN MEMORY FOR TEST SYSTEMS

(75) Inventor: Rochit Rajsuman, Santa Clara, CA (US)

(73) Assignee: Advantest Corporation, Gunma (JP)

( * ) Notice: Subject to any disclaimer, the term of this patent is extended or adjusted under 35 U.S.C. 154(b) by 425 days.

(21) Appl. No.: 10/294,601

(22) Filed: Nov. 14, 2002

(65) Prior Publication Data

US 2004/0098650 A1 May 20, 2004

(51) Int. Cl.$^7$ .............................................. G01R 31/28
(52) U.S. Cl. ..................................... 714/735; 714/743
(58) Field of Search ..................... 711/157; 365/230.04; 714/738, 724, 735, 743

(56) References Cited

U.S. PATENT DOCUMENTS

| | | | | |
|---|---|---|---|---|
| 5,280,594 A | * | 1/1994 | Young et al. | 711/157 |
| 5,285,421 A | * | 2/1994 | Young et al. | 365/230.04 |
| 6,014,764 A | * | 1/2000 | Graeve et al. | 714/738 |
| 6,243,841 B1 | * | 6/2001 | Mydill | 714/724 |

* cited by examiner

Primary Examiner—David Ton
(74) Attorney, Agent, or Firm—Morrison & Foerster LLP

(57) ABSTRACT

A method for applying test vectors to a device under test (DUT) at a speed of the DUT is disclosed. A pattern memory is re-organized into m modules, where m is a DUT/pattern memory speed ratio. Delay circuits in address lines of each module are programmed such that an address signal for a qth module is delayed by (q−1) delay units, where each delay unit is equivalent to one DUT clock cycle. Patterns for each test are stored in these modules according to [n mod m]; where n is a number of patterns in a test. Identical addresses are simultaneously applied to the delay circuits of the m modules according to a fixed address sequence at a rate f equal to or slower than the operating frequency of the pattern memory, such that a period of f is equal to or greater than (m−1) delay units.

33 Claims, 9 Drawing Sheets

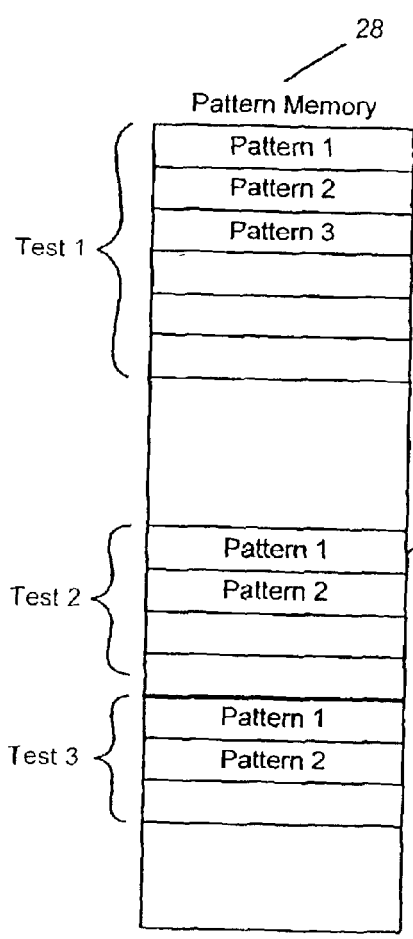
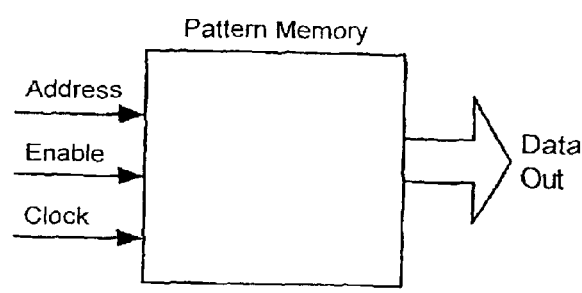
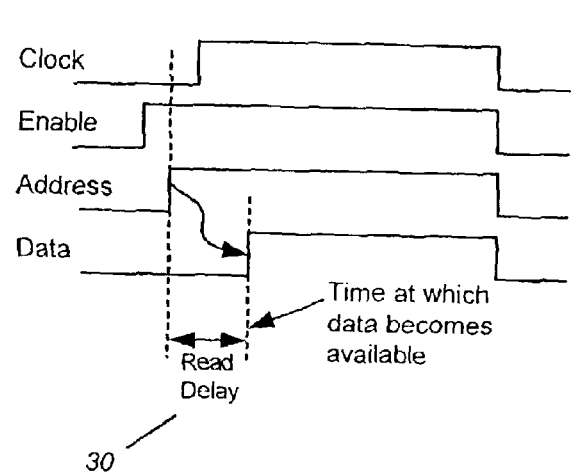
FIG. 1a
FIG. 1b

HIGH SPEED VECTOR ACCESS METHOD FROM PATTERN MEMORY FOR TEST SYSTEMS

BACKGROUND OF THE INVENTION

1. Field of the Invention

The present invention relates, generally, to automatic test equipment (ATE) and, in one embodiment, to a method for providing high speed test vectors to a device under test (DUT) at the speed of the DUT.

2. Description of Related Art

The general speed of present day semiconductor memories is considerably slower than the speed of computational logic such as microprocessors. For example, a number of microprocessors are currently available at clock rates above 2 GHz (500 ps clock periods), while the read/write cycle time of the fastest static random access memory (SRAM) is about 2 ns and the read/write cycle time of dynamic random access memory (DRAM) is about 4 to 5 ns. Even specialized structures such as the Rambus® DRAM only provides data rates up to 800 MHz (although the specifications for the next generation Rambus® DRAM are 1 GHz). Thus, even with the fastest memory chips available today, the speed difference between memory and computational logic such as microprocessors creates a bottleneck on how fast a system can work.

To overcome memory latency, conventional computer systems pre-fetch anticipated instructions and operands (data expected to be used in subsequent computations) from system memory and store this anticipated data in multiple levels of on-chip instruction cache and data cache memories. For example, a Pentium® microprocessor uses two levels of cache (level-1 and level-2) to store the anticipated pre-fetch data. A portion of the anticipated data (generally referred to herein as a page) upon which a computation may be performed is stored in the data cache memory. While the central processing unit (CPU) performs the computation, data (instructions and operands) for the next anticipated computation (the next page) is fetched and stored in the cache memory. Thus, memory latency in data access is avoided for the system. This approach works in a majority of cases. However, once in awhile, anticipation on next operation becomes invalid. (By definition, the pre-fetching of anticipated data is a guess, and every once in awhile a wrong guess is made.) Subsequently, anticipated pre-fetched data in the cache becomes invalid. This is generally known as a page miss. Computation stalls when a page miss occurs, because the CPU has to wait until valid data is fetched from the memory.

Multi-threading computation overcomes page-miss limitations to a large extent. In multi-threading computation, the CPU performs multiple computations simultaneously (each computation is called as a thread). When a page-miss occurs on one computation (one thread), that computation stalls but other computations (other threads) continue and thus, the CPU remains active.

Although in principle, ATE systems are computer systems and a majority of computations follow the same principles as other computer systems, ATE systems are saddled with additional operational constraints. One constraint is due to the sequential vector-driven nature of ATE systems. To test an integrated circuit (IC), test patterns (test vectors) for that IC are stored in the pattern memory of the ATE. The pattern memory is equivalent to system memory of a computer system. However, instead of fetching a page, only one vector is fetched at a time (per cycle). This vector is applied to the DUT, a response from the DUT is obtained and compared with the expected value, and a pass/fail determination is made.

If at-speed testing (testing at the maximum rated speed of the device) is desired, a GHz DUT requires that the pin electronics of the ATE system apply patterns to the DUT at the same GHz rate. While the ATE clock and CPU can operate at the same GHz rate, as noted above the pattern memory cannot provide patterns at the same rate, which limits the test application rate. The previously described method of pre-fetching anticipated test vectors and storing them in cache is not applicable because a fixed stream of vectors is needed at the speed of DUT, one vector at a time, and the latency for accessing one vector either from pattern memory or from cache is the same for the ATE pin electronics. This limitation is unique to ATE systems, and becomes critical when DUT frequencies are on the order of GHz.

The preceding paragraphs demonstrate that at-speed testing of high speed DUTs is facilitated by presenting test vectors at the speed of the DUT operating frequency. A solution has not been previously available to overcome the latency of pattern memory in the ATE systems. Therefore, a need exists for a method that provides test vectors to a DUT at the speed of the DUT while overcoming the limitation imposed by memory latency.

SUMMARY OF THE INVENTION

Embodiments of the present invention are directed to a method for providing test vectors to a DUT at the speed of the DUT utilizing a new design of pattern memory and a specialized organization of test vectors in the pattern memory, and accessing the test vectors in such a way that the availability of test vectors matches the DUT frequency. With this method, regardless of the memory latency of pattern memory, patterns can be applied at the DUT clock rate even when the DUT clock rate is higher than the pattern memory access rate.

The overall general methodology of one embodiment of the present invention can be summarized as follows: (1) determine a DUT/pattern memory speed ratio by dividing the DUT operating frequency by the operating frequency of the pattern memory, and rounding up to a higher integer if the ratio is fractional; (2) organize the pattern memory into m modules, where m is an integer equal to or greater than the DUT/pattern memory speed ratio; (3) insert one delay circuit into a portion of an address line for each of the m modules for delaying an address for the qth module by (q−1) delay units, where q varies from one to m and one delay unit represents approximately one DUT clock cycle; (4) store n test patterns into the m modules in a fixed repeating module order according to [n mod m], the storing of test patterns into any one module for each of the m modules following a fixed address sequence (i.e., as test patterns are stored into a particular module, the addresses at which the test patterns are stored follow a fixed sequence, such as in consecutive address locations); and (5) simultaneously apply identical addresses to the delay circuits of the m modules according to the fixed address sequence at a rate f equal to or slower than the operating frequency of the pattern memory, such that the period of f is equal to or greater than (m−1) delay units. The delay circuits cause the identical addresses to be applied to the address lines of the m modules in a time-staggered manner, resulting in generation of the m test patterns in each period of f, with one test pattern becoming available at a time, at the DUT operating frequency.

In other embodiments of the present invention, the delay circuits may be inserted into the clock lines instead of the address lines for each of the m modules, or inserted into both the clock and address lines. Alternatively, the delay circuits may be inserted in the memory module outputs instead of the address lines. In this configuration, the memory module accesses are simultaneous, but the availability of successive test patterns from the memory modules is delayed by one DUT clock period. Nevertheless, for any of these alternatives, the net result is the same, with test patterns effectively being available at the DUT clock frequency.

For maximum versatility in testing DUTs of various speeds utilizing memory of various speeds, configurable memory modules and programmable delay circuits may be employed. Configuration circuitry may be used to configure memory space into the desired number of independently addressable modules and insert a delay circuit into the address, clock or output lines of each module based on the DUT/pattern memory speed ratio. The programmable delay circuits should have delay resolution of one delay unit, which should be at least as small as one DUT clock period. Finer resolution allows the tester to be adapted to DUTs with different clock rates. A representation of the DUT operating frequency may be applied to memory management configuration circuitry to program a delay of (q−1) delay units into the address, clock or output lines of the qth module.

BRIEF DESCRIPTION OF THE DRAWINGS

FIG. 1a illustrates an example pattern memory including stored arrangements of tests in conventional Automatic Test Equipment systems.

FIG. 1b illustrates an example structure of pattern memory and a timing diagram for data access in conventional Automatic Test Equipment systems.

DETAILED DESCRIPTION OF PREFERRED EMBODIMENTS

Figure 2:
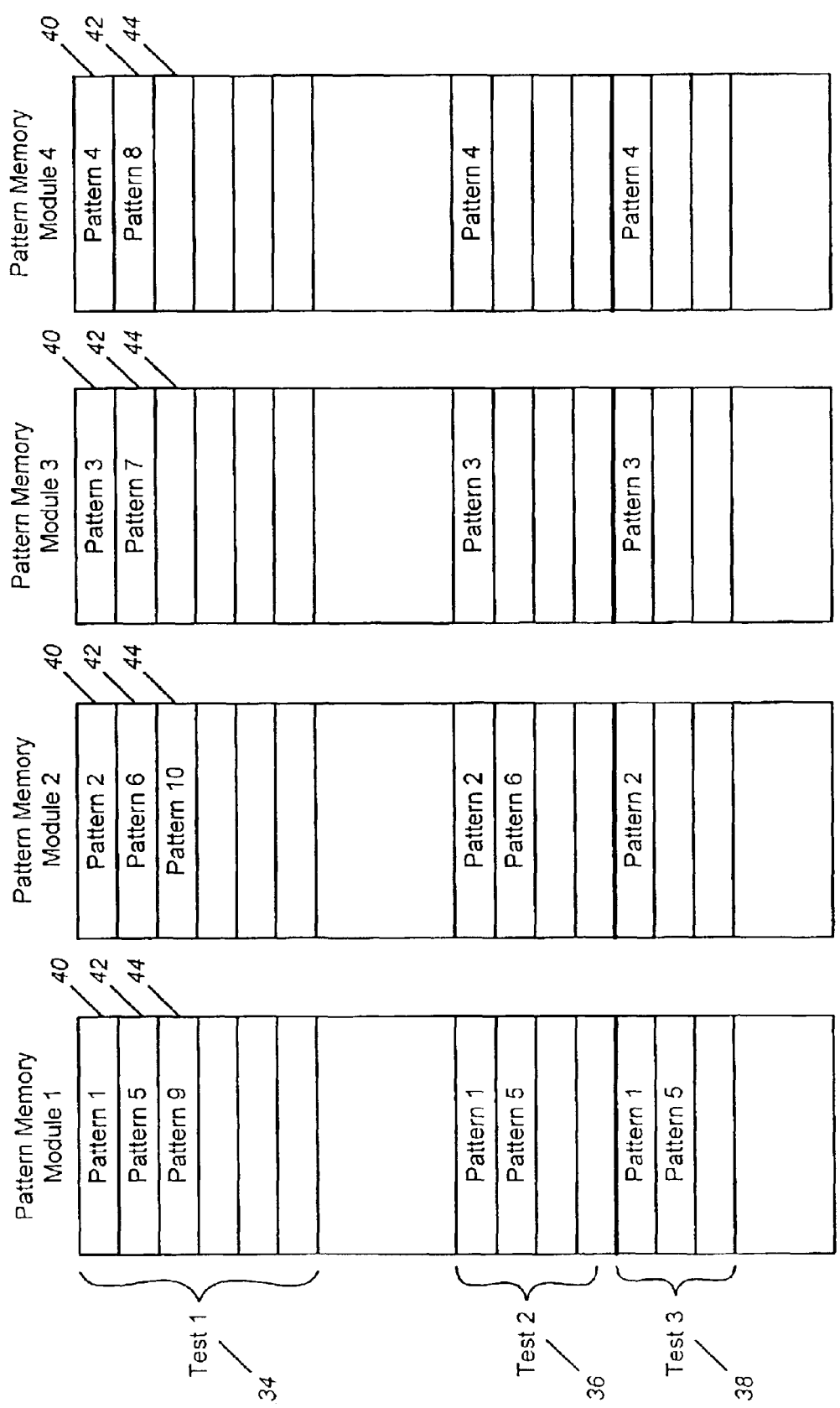
FIG. 2 illustrates an example pattern memory reorganized into modules and including re-organized stored arrangements of tests according to an embodiment of the present invention.

In the following description of preferred embodiments, reference is made to the accompanying drawings, which form a part hereof, and in which is shown by way of illustration specific embodiments in which the invention may be practiced. It is to be understood that other embodiments may be utilized and structural changes may be made without departing from the scope of the preferred embodiments of the present invention.

Embodiments of the present invention provide test vectors to a DUT at the speed of the DUT utilizing a new design of pattern memory and a specialized organization of test vectors in the pattern memory, and access the test vectors in such a way that the availability of test vectors matches the DUT frequency. Test vectors therefore become available at a higher rate than the memory access time. In this manner, the DUT can be tested at its normal speed in spite of memory latency.

An example arrangement of pattern memory 28 in conventional ATE systems is shown in FIG. 1a. For purposes of illustration only, three tests are shown in the pattern memory, each test comprising multiple patterns. The test patterns of a particular test are typically applied in sequential order, and thus in FIG. 1a they are stored sequentially in the pattern memory. In one example, when an address, clock and enable signal are applied, data (a pattern) is read (i.e. fetched) from the memory. This data or pattern becomes available at the output of pattern memory after a memory access delay 30 as shown in FIG. 1b. In the example pattern memory of FIG. 1b, the test pattern becomes available only after the enable is asserted to a high state, the address state becomes valid (high), the clock is high, and a read delay time interval has passed. Note that the address state shown in FIG. 1b is simply an invalid/valid indication (invalid =low, valid =high), and does not represent a value of the address bus. It should also be understood that the pattern memory of FIG. 1b is just an example, and that embodiments of the present invention are applicable to other memories that are accessed using other methods (e.g. without a clock).

The patterns of a test are fetched sequentially and applied to the DUT in the same order. When a test is completed, the address of the next test (see, e.g., location 32 in FIG. 1a) is applied, and the patterns associated with that test are fetched and applied to the DUT. As mentioned above, the cache architecture of computer systems is not applicable in ATE systems because fetching a test and storing it in the cache does not help; the primary reason being that the cache access time and the access time from pattern memory are equivalent for the pin electronics. Nevertheless, the individual patterns still need to become available in sequential order at the pin electronics with a higher speed than the memory access time. If patterns are not available to the pin electronics at the rate of DUT frequency, the drivers cannot apply the test patterns to the DUT and hence the test rate becomes limited to the rate at which the test patterns can be made available (the rate at which test patterns are available to the pin electronics).

To overcome this limitation, embodiments of the present invention utilize a new design for the pattern memory. Memory management configuration circuitry reorganizes the pattern memory in a modularized form according to a ratio of the desired rate of test application and the rate at which patterns are available from the pattern memory (e.g., DUT operating frequency divided by operating frequency of pattern memory). For example, if the desired rate of test application is 2 GHz (i.e. the duty cycle of the DUT clock being 500 ps), and patterns from memory are available at 500 MHz (1 pattern every 2 ns), then the pattern memory is reorganized into 2 GHz/500 MHz=4 modules. If this DUT/pattern memory speed ratio is not an integer, the next highest integer is used to determine the number of modules.

In alternative embodiments, it is also possible to use other higher integers to determine the number of modules. In such an embodiment, the DUT would still be tested at speed, while the memory would be accessed at less than its highest rate. To illustrate, if the desired rate of test application is 2 GHz, and patterns from memory are available at 450 MHz, then the computation is 2 GHz/450 MHz=4.4, and rounded up to the next highest integer, the pattern memory could be reorganized into five modules. In this configuration, the memory modules could be accessed at or near their maximum rates. Alternatively, six or more modules could be used, with the memory modules being accessed at less than their maximum rates.

In one embodiment of the present invention, the patterns of each test are stored in these modules in sequential order or any fixed repeating module order. Each module is independently and simultaneously addressable and readable. In general, if there are n patterns in a test and the pattern memory is comprised of m modules, then the patterns are stored in [n mod m]format. For example, if a test has 10 patterns and the pattern memory is comprised of four modules, then the patterns may be stored as follows:

| Address | Module 1 | Module 2 | Module 3 | Module 4 |
| --- | --- | --- | --- | --- |
| A0 | Pattern 1 | Pattern 2 | Pattern 3 | Pattern 4 |
| A1 | Pattern 5 | Pattern 6 | Pattern 7 | Pattern 8 |
| A2 | Pattern 9 | Pattern 10 | | |

This example arrangement is shown in FIG. 2, wherein the four modules are marked as Module 1, Module 2, Module 3 and Module 4, and the exemplary test shown in the table above is indicated at 34. For purposes of comparison with FIG. 1a, the example of FIG. 2 includes a total of three tests indicated at 34, 36 and 38, each with multiple patterns. Within each module, patterns may be stored in consecutive addresses or in a fixed address sequence. For example, in the table above, addresses A0, A1 and A2 can be made consecutive by varying the least significant bit (LSB) (e.g. 0000, 0001, 0010), or in a fixed address sequence by varying other bits (e.g. 0000, 0010, 0100).

Figure 3:
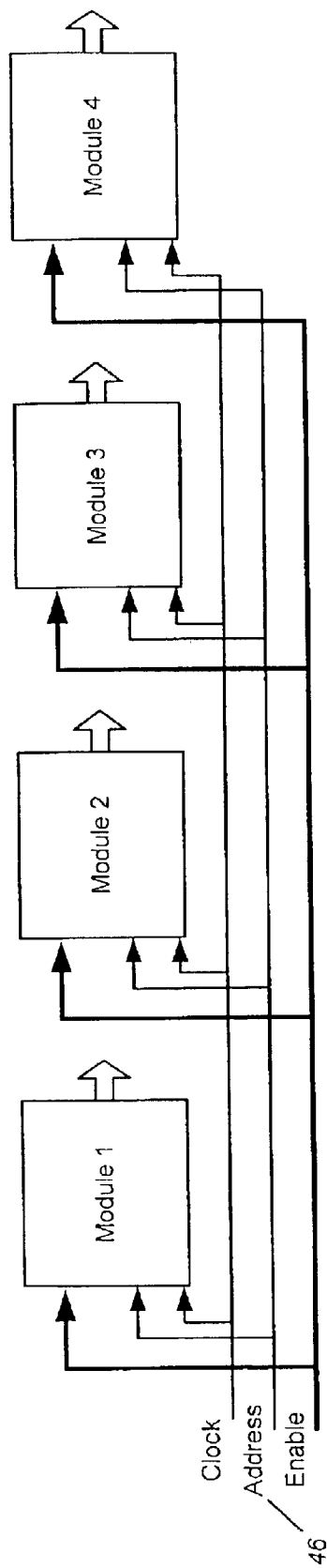
FIG. 3 illustrates an example memory module block diagram and a timing diagram of simultaneous data accesses from multiple modules according to an embodiment of the present invention.
Figure 3:
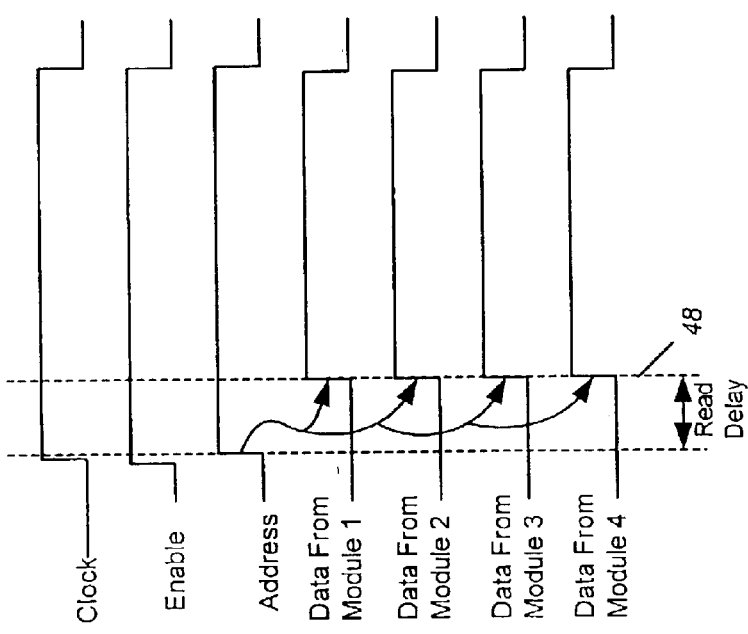

With the pattern memory organized into independently addressable modules with patterns stored according to an [n mod m] format, m patterns become available simultaneously when an enable signal, clock, and a test address 46 are applied to the pattern memory as shown in the example architecture of FIG. 3. Again, it should be understood that the type of memory illustrated in FIG. 3 is exemplary only, and that other types of memory (e.g., without a clock) may be used. The architecture of FIG. 3 effectively allows the fetching of m patterns simultaneously, and hence overcomes the problem of slow memory access. For example, referring again to Test 1 of FIG. 2, if the enable signal is asserted and address 40 is applied to each module, patterns 1–4 should become simultaneously available. If address 42 is subsequently applied to each module, patterns 5–8 should become simultaneously available. Finally, if address 44 is subsequently applied to each module, patterns 9 and 10 should become simultaneously available.

Figure 4:
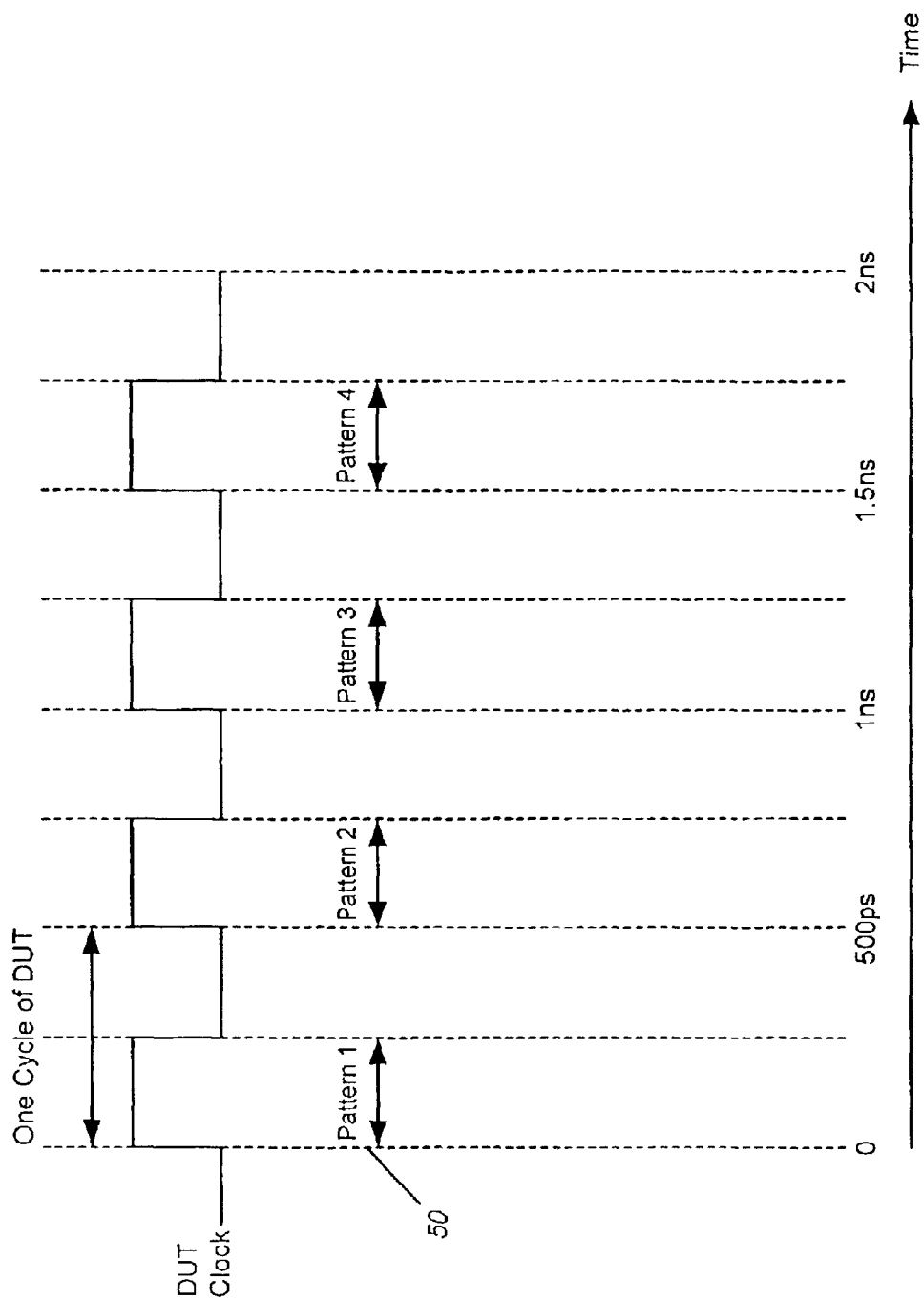
FIG. 4 is a timing diagram illustrating when patterns should become available to the Device Under Test in an exemplary high speed tester operable in conjunction with embodiments of the present invention.

However, although m patterns may be simultaneously available at time 48 in FIG. 3, m patterns cannot be applied simultaneously to a DUT. As described above, the desired result is the sequential application of test patterns at the speed of the DUT. In other words, if the DUT clock is 2 GHz and four patterns from the memory are simultaneously fetched at a rate of 500 MHz, then these four patterns should actually be applied to the DUT in a staggered time sequence 50 as shown in the example of FIG. 4. Note that the timing of patterns shown in FIG. 4 with respect to the DUT clock is merely exemplary, and that other test pattern/DUT clock timing relationships are possible. For example, the patterns of FIG. 4 could be available for the entire DUT clock cycle.

Figure 5:
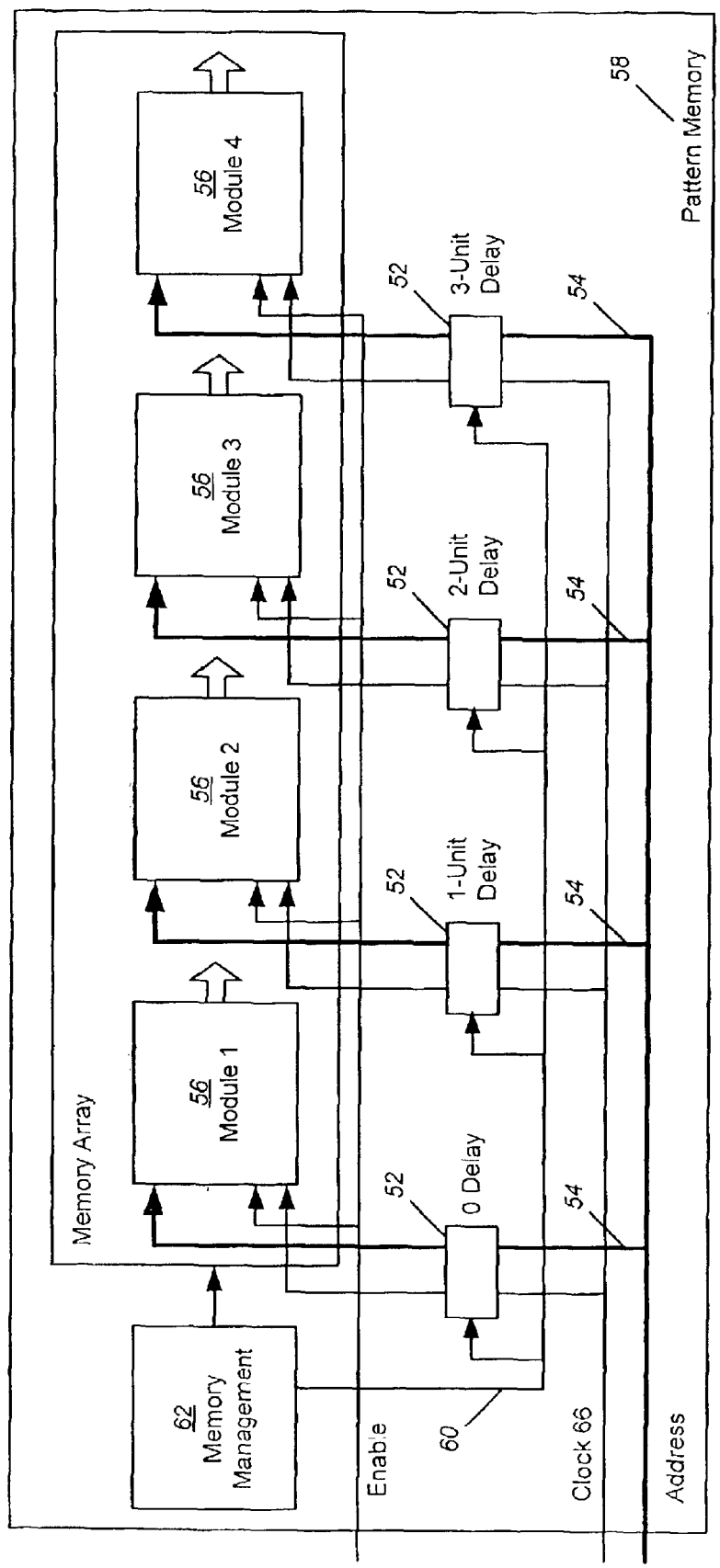
FIG. 5 is an example block diagram of a pattern memory and configurable delay circuits in the address and clock lines according to an embodiment of the present invention.

To achieve this application of patterns in a time-staggered sequence, one embodiment of the present invention illustrated in FIG. 5 utilizes one programmable address and clock delay circuit 52 in the address line 54 and clock line 66 of each module 56 of the pattern memory 58. Note that each programmable address delay circuit 52 delays all of the address lines of a specific module 56 by a like amount. These programmable delay circuits 52 are configurable by configuration lines 60 from memory management block 62 to produce a delay approximately equivalent to a certain number of delay units. In one embodiment, an (m–1) delay multiplication factor is used with each module. For example, in the case of four modules as shown in FIG. 5, configuration lines 60 program the delay circuits 52 such that a delay of zero delay units is inserted into the address and clock lines of Module 1, a delay of one delay unit is inserted into the address and clock lines of Module 2, a delay of two delay units is inserted into the address and clock lines of Module 3, and a delay of three delay units is inserted into the address and clock lines of Module 4, wherein one delay unit is equal to one clock cycle of the DUT. The programmed delay circuits 52 in the example embodiment of FIG. 5 will delay successive memory module accesses by one period of the DUT clock and effectively enable test patterns to be available at the DUT clock frequency, a higher speed than ordinarily possible given the speed limitations of the pattern memory. If, for example, the read/write cycle time of the memory is 500 MHz and the at-speed DUT frequency is 2 GHz, successive memory module accesses are delayed by 500 ps and test patterns can become available and applied at the 2 GHz DUT frequency. It should be understood that the test patterns read from the memory modules become available to pin electronics as they are read, and the pin electronics can apply them to the DUT as they become available. Although no connection from the memory modules to the DUT is illustrated in FIG. 5, those skilled in the art will understand that additional circuitry such as multiplexers and drivers may be employed between the memory modules and the DUT.

As noted above, embodiments of the present invention may employ more modules than required by the DUT/pattern memory speed ratio. For example, although the DUT/memory speed ratio may be computed to be the integer five, six or more modules could be used. The effect of using more modules than required is that the memory modules will be accessed at less than their maximum rates. Continuing the present example for purposes of illustration only, if 10 memory modules are used, then after the 10 memory modules are simultaneously accessed, a memory module would not be accessed again until after the outputs of all 10 memory modules became available, one by one, due to the programmed delay circuits. This memory access rate would be maintained even though the memory could actually be accessed at roughly twice that rate.

Although not shown in FIG. 5, in an alternative embodiment of the present invention the delay circuits may be inserted only in the address lines of the modules, or only in the clock lines of the modules, depending on the type of pattern memory being used. Alternatively, the delay circuits may be inserted in the memory module outputs instead of the address and/or clock lines. In this latter alternative configuration, the memory module accesses are simultaneous, but the availability of successive test patterns from the memory modules is delayed by one DUT clock period. Nevertheless, in any of these alternatives, the net result is the same, with test patterns effectively being generated at the DUT clock frequency.

For maximum versatility in testing DUTs of various speeds utilizing memory of various speeds, embodiments of the present invention employ configurable memory modules and programmable delay circuits. In a basic embodiment, the available memory is divided into an array of separate chips, each chip being independently addressable. Each chip may represent one module, or configuration circuitry may combine two or more chips to create a single module with the required pattern depth. The configuration circuitry then enables only the precise number of modules needed, as defined by the DUT/pattern memory speed ratio. An array of programmable delay circuits is also provided in one or more packages. The configuration circuitry connects one programmable delay circuit into the clock and/or address lines of each module. In an alternative embodiment, the memory may be considered as a single memory space, contained in one or more chips. Specialized address circuitry configures the memory space into the precise number of independently addressable modules needed, as defined by the DUT/ memory speed ratio, with each module having the pattern depth needed for a particular test. The configuration circuitry programs and connects one programmable delay circuit into the clock and/or address lines of each module.

As described above, the programmable delay circuits should have delay resolution of one delay unit, which should be at least as small as one DUT clock period. Finer resolution allows the tester to be adapted to DUTs with different clock rates. A representation of the DUT operating frequency may be applied to memory management configuration circuitry to program a delay of (q−1) delay units into the address lines of the qth module. Programmable delay circuits are described in "Delay Time Insertion for Event Based Test System," U.S. patent application Ser. No. 09/535,031, and "Timing Signal Generation Circuit for Semiconductor Test System", U.S. Pat. No. 6,172,544, the contents of which are incorporated herein by reference. Note that although programmable delay circuits enable a tester to provide test patterns at a variety of DUT clock frequencies, in alternative embodiments the delay circuits may contain fixed delays for dedicated testers.

Figure 6A:
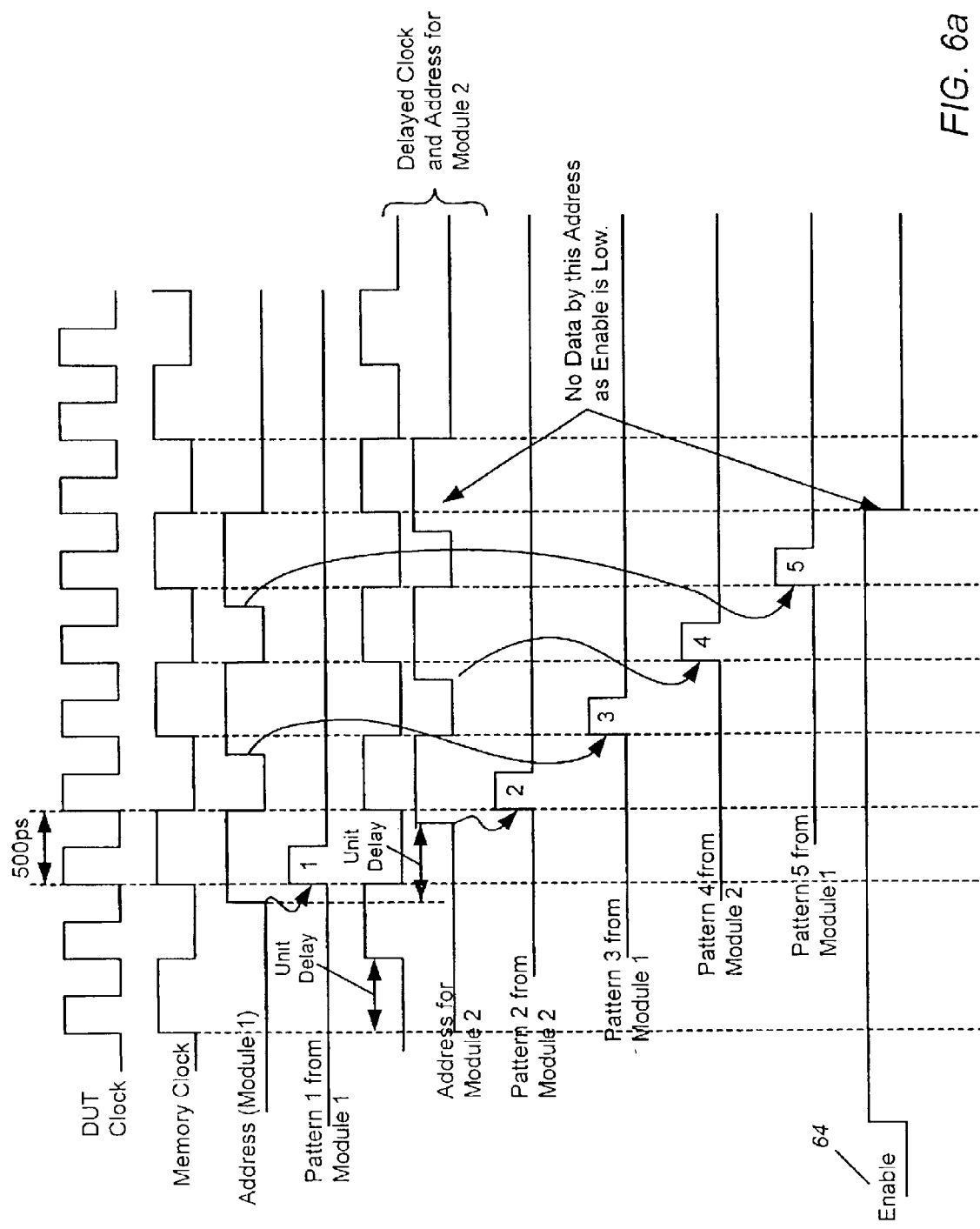
FIG. 6a is an example timing diagram associated with the example block diagram of FIG. 5, illustrating the fetching of five test patterns from two modules of pattern memory to match the fetch rate with DUT frequency when the memory frequency is half of the DUT frequency, with addresses and patterns shown as invalid or valid states, according to an embodiment of the present invention.
Figure 6B:
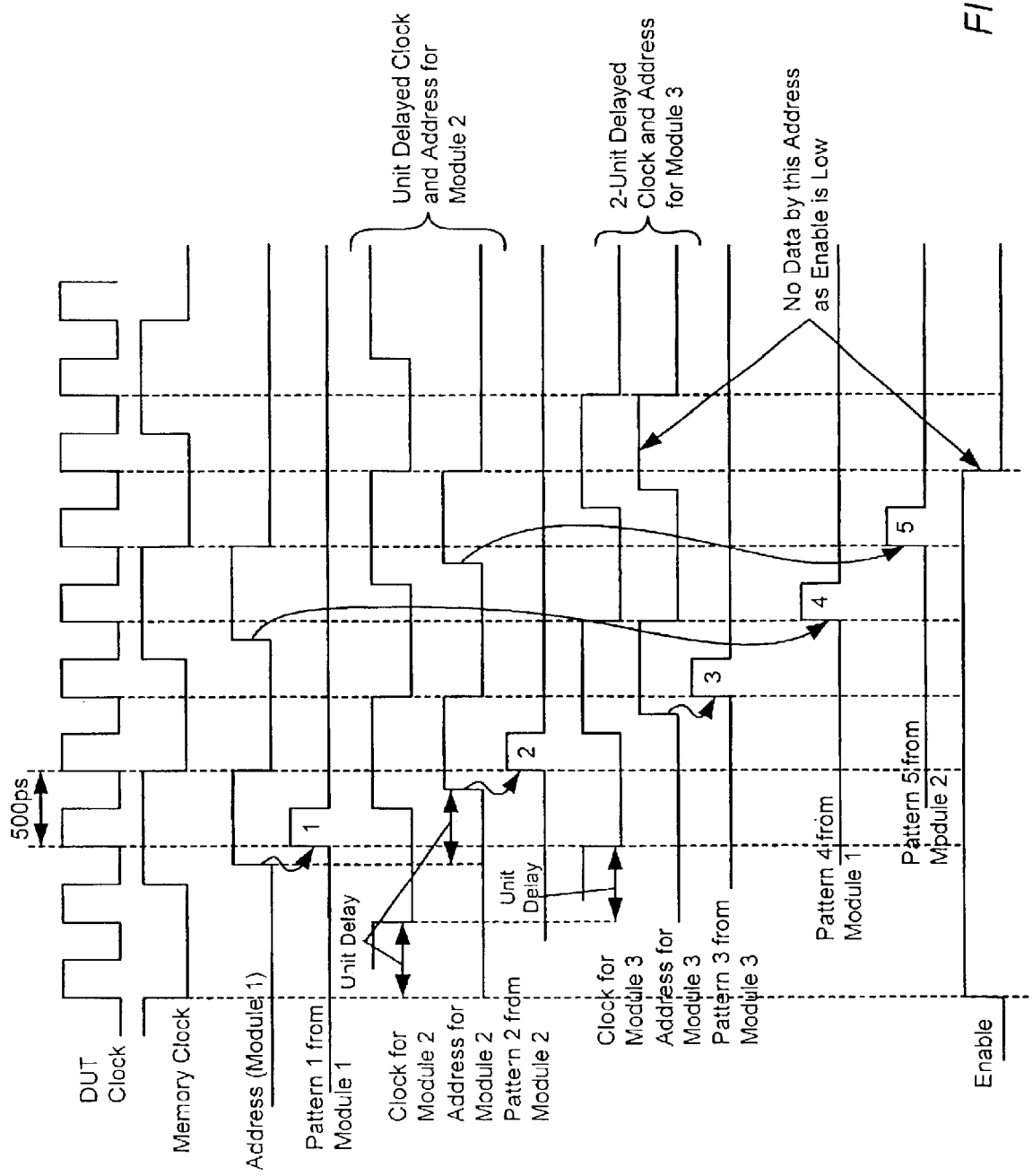
FIG. 6b is an example timing diagram associated with the example block diagram of FIG. 5, illustrating the fetching of five test patterns from three modules of pattern memory to match the fetch rate with DUT frequency when the memory frequency is one-third of the DUT frequency, with addresses and patterns shown as invalid or valid states, according to an embodiment of the present invention.

To illustrate the embodiment of the present invention shown in FIG. 5, two examples are provided in FIGS. 6a and 6b. In both examples, five patterns in a test were assumed in order to demonstrate continuous operation. However, in FIG. 6a, the memory access time is one-half of the DUT clock period, while in FIG. 6b the memory access time is one-third of the DUT clock period. These two examples cover odd and even DUT/pattern memory speed ratios and are representative of the present-day speed differential between memory and logic. It should be noted that the enable signal 64 in FIGS. 6a and 6b define the start and end of the test; patterns are read only when the enable signal 64 is high.

In the example pattern memory of FIGS. 6a and 6b, the test pattern becomes available only after the enable is asserted to a high state, the address state becomes valid (high), the clock is high, and a read delay time interval has passed. Note that the address state shown in FIGS. 6a and 6b is simply an invalid/valid indication (invalid=low, valid= high), and does not represent a value of the address bus. Although the address states in FIGS. 6a and 6b are shown as being valid only until the memory clock goes low, in embodiments of the present invention the addresses may remain valid for a full memory clock period. Note also that the pattern states shown in FIGS. 6a and 6b are simply an invalid/valid indication (invalid=low, valid=high), and do not represent output values from the pattern memory. Although the pattern states in FIGS. 6a and 6b are shown as being valid for only one half of a DUT clock period, in embodiments of the present invention the patterns may remain valid for a full DUT clock period. In the present example, the DUT is able to receive the test patterns while the DUT clock is high. However, in other embodiments, the DUT may synchronously clock test patterns on the falling edge of the DUT clock, for example. It should also be understood that the pattern memory of FIGS. 6a and 6b is just one example, and that embodiments of the present invention are applicable to other memories that are accessed using other methods (e.g. without a clock).

Figure 7A:
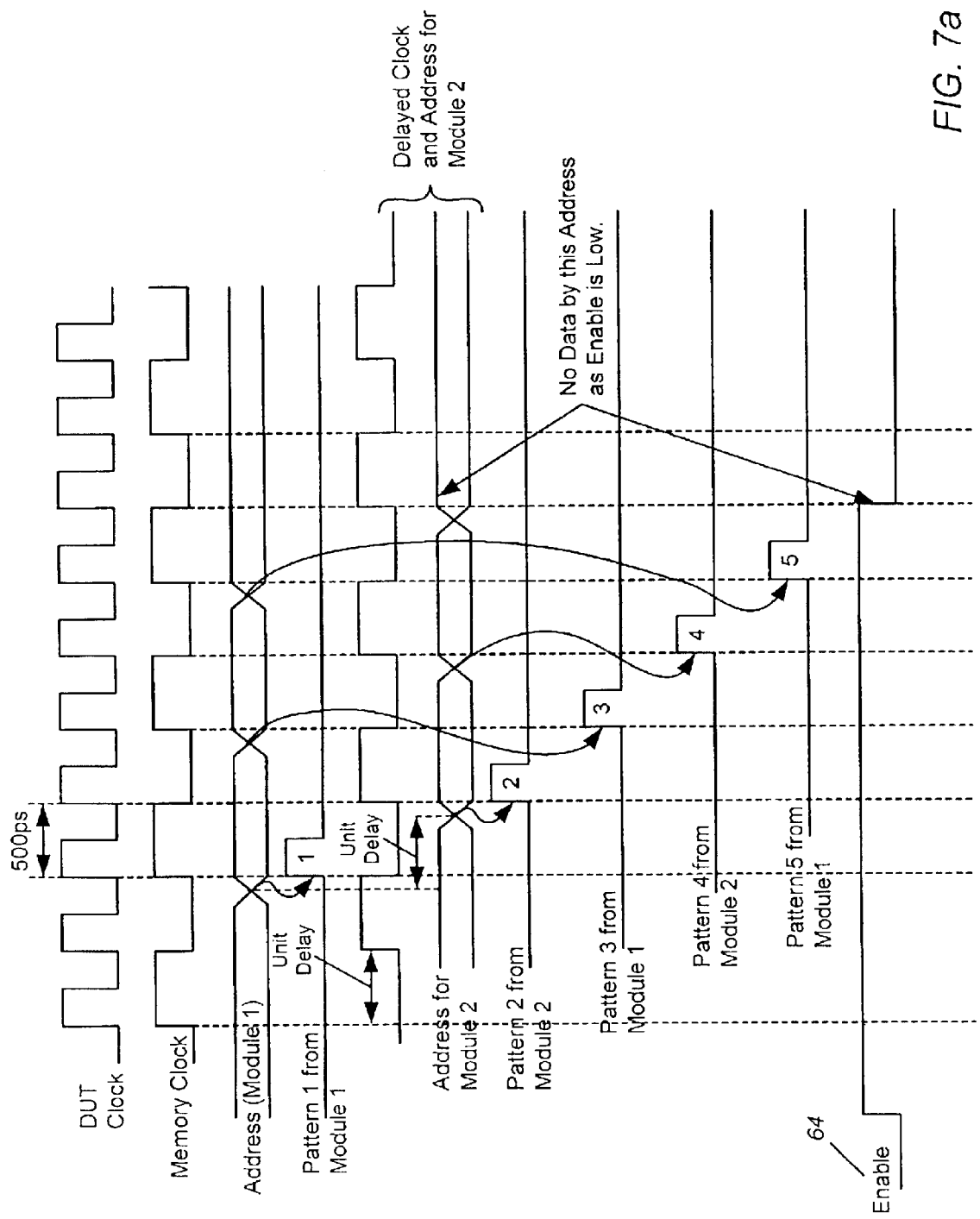
FIG. 7a is an example timing diagram which is identical to the timing diagram of FIG. 6a, except that the addresses are shown as an address bus changing from one valid state to another, according to an embodiment of the present invention.
Figure 7B:
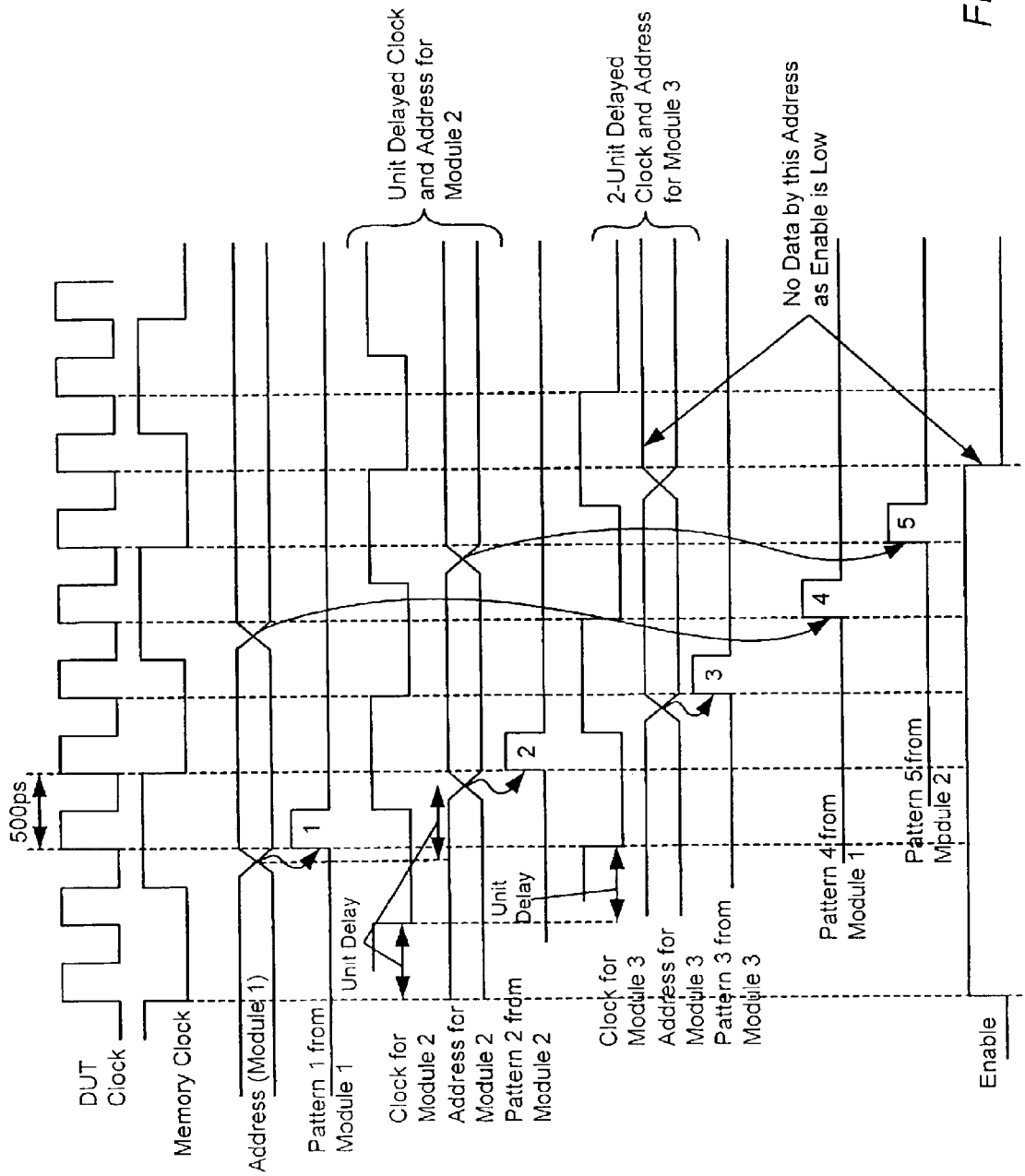
FIG. 7b is an example timing diagram which is identical to the timing diagram of FIG. 6b, except that the addresses are shown as an address bus changing from one valid state to another, according to an embodiment of the present invention.

FIGS. 7a and 7b illustrate the identical examples of FIGS. 6a and 6b, respectively, except that FIGS. 7a and 7b show an address bus changing from one valid state to another.

It should be noted that although only two examples have been provided herein to illustrate embodiments of the present invention, the method itself is generalized and applicable to any operating frequency of the DUT and operating frequency of the pattern memory, so long as the operating frequency of the DUT exceeds the operating frequency of the pattern memory.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A method for fetching test patterns from a pattern memory at an operating frequency of a device under test (DUT) which is higher than an operating frequency of the pattern memory, comprising:

determining a DUT/pattern memory speed ratio by dividing the DUT operating frequency by an operating frequency of the pattern memory, and rounding up to a higher integer if the ratio contains a fractional part;

organizing the pattern memory into m modules, where m is an integer equal to or greater than the DUT/memory speed ratio;

inserting one address delay circuit in a portion of an address line unique to each of the m modules for delaying an address for the qth module by (q−1) delay units, where q varies from one to m and one delay unit represents approximately one DUT clock cycle;

storing n test patterns into the m modules in a fixed repeating module order according to [n mod m], the storing of test patterns into any one module for each of the m modules following a fixed address sequence; and simultaneously applying identical addresses to the address delay circuits of the m modules according to the fixed address sequence at a rate f equal to or slower than the operating frequency of the pattern memory, such that a period of f is equal to or greater than (m−1) delay units;

wherein the address delay circuits cause the identical addresses to be applied to the address lines of the m modules in a time-staggered manner, resulting in fetching of m test patterns in each period of f, one test pattern at a time, at the DUT operating frequency.

2. The method as recited in claim 1, further comprising receiving a memory enable signal for defining a start and end of the test pattern fetching from the pattern memory.

3. The method as recited in claim 1, further comprising applying the DUT/pattern memory speed ratio to memory management configuration circuitry for organizing the pattern memory into m modules.

4. The method as recited in claim 1, further comprising applying a representation of the DUT operating frequency to memory management configuration circuitry for programming a delay of (q−1) delay units into the address delay circuits of the address lines of the qth module.

5. The method as recited in claim 1, further comprising:
inserting one clock delay circuit in a portion of a clock line unique to each of the m modules for delaying a clock for the qth module by (q−1) delay units; and
simultaneously applying an identical clock to the clock delay circuits of the m modules at the rate f;
wherein the clock delay circuits cause the identical clock to be applied to the clock lines of the m modules in a time-staggered manner.

6. The method as recited in claim 5, further comprising receiving a memory enable signal for defining a start and end of the test pattern fetching from the pattern memory.

7. The method as recited in claim 5, further comprising applying the DUT/pattern memory speed ratio to memory management configuration circuitry for organizing the pattern memory into m modules.

8. The method as recited in claim 5, further comprising applying a representation of the DUT operating frequency to memory management configuration circuitry for programming a delay of (q−1) delay units into the address and clock lines of the qth module.

9. A method for fetching test patterns from a pattern memory at an operating frequency of a device under test (DUT) which is higher than an operating frequency of the pattern memory, comprising:
determining a DUT/pattern memory speed ratio by dividing the DUT operating frequency by an operating frequency of the pattern memory, and rounding up to a higher integer if the ratio contains a fractional part;
organizing the pattern memory into m modules, where m is an integer equal to or greater than the DUT/memory speed ratio;
inserting one clock delay circuit in a portion of a clock line unique to each of the m modules for delaying a clock for the qth module by (q−1) delay units, where q varies from one to m and one delay unit represents approximately one DUT clock cycle;
storing n test patterns into the m modules in a fixed repeating module order according to [n mod m], the storing of test patterns into any one module for each of the m modules following a fixed address sequence; and
simultaneously applying an identical clock to the clock delay circuits of the m modules at a rate f equal to or slower than the operating frequency of the pattern memory, such that a period of f is equal to or greater than (m−1) delay units;
wherein the clock delay circuits cause the identical clock to be applied to the clock lines of the m modules in a time-staggered manner, resulting in fetching of m test patterns in each period of f, one test pattern at a time, at the DUT operating frequency.

10. The method as recited in claim 9, further comprising receiving a memory enable signal for defining a start and end of the test pattern fetching from the pattern memory.

11. The method as recited in claim 9, further comprising applying the DUT/pattern memory speed ratio to memory management configuration circuitry for organizing the pattern memory into m modules.

12. The method as recited in claim 9, further comprising applying a representation of the DUT operating frequency to memory management configuration circuitry for programming a delay of (q−1) delay units into the clock line of the qth module.

13. A method for fetching test patterns from a pattern memory at an operating frequency of a device under test (DUT) which is higher than an operating frequency of the pattern memory, comprising:
determining a DUT/pattern memory speed ratio by dividing the DUT operating frequency by an operating frequency of the pattern memory, and rounding up to a higher integer if the ratio contains a fractional part;
organizing the pattern memory into m modules, where m is an integer equal to or greater than the DUT/pattern memory speed ratio;
inserting one output delay circuit into output lines unique to each of the m modules for delaying an output for the qth module by (q−1) delay units, where q varies from one to m and one delay unit represents approximately one DUT clock cycle;
storing n test patterns into the m modules in a fixed repeating module order according to [n mod m], the storing of test patterns into any one module for each of the m modules following a fixed address sequence; and
simultaneously applying identical addresses to address inputs of the m modules according to the fixed address sequence at a rate f equal to or slower than the operating frequency of the pattern memory, such that a period of f is equal to or greater than (m−1) delay units;
wherein the output delay circuits cause test patterns to become available in a time-staggered manner, resulting in fetching of m test patterns in each period of f, one test pattern at a time, at the DUT operating frequency.

14. The method as recited in claim 13, further comprising receiving a memory enable signal for defining a start and end of the test pattern fetching from the pattern memory.

15. The method as recited in claim 13, further comprising applying the DUT/pattern memory speed ratio to memory management configuration circuitry for organizing the pattern memory into m modules.

16. The method as recited in claim 13, further comprising applying a representation of the DUT operating frequency to memory management configuration circuitry for programming a delay of (q−1) delay units into the output delay circuits of the output lines of the qth module.

17. A method for fetching test patterns from a pattern memory at an operating frequency of a device under test (DUT) which is higher than an operating frequency of the pattern memory, comprising:

organizing the pattern memory into m modules, where m is an integer selected such that a product ((m−1)×1 DUT clock cycle) is less than or equal to an access time p of the pattern memory;

storing n test patterns into the m modules in a fixed repeating module order according to [n mod m], the storing of test patterns into any one module for each of the m modules following a fixed address sequence;

applying an identical address to the m modules in a time-staggered manner for retrieving m test patterns such that a qth module in the fixed repeating module order receives the address after a delay of q−1 delay units, where q varies from one to m and one delay unit represents approximately one DUT clock cycle; and simultaneously applying subsequent identical addresses to the m modules in the time-staggered manner for retrieving the remaining n−m test patterns, the subsequent identical addresses following the fixed address sequence and applied with a period equal to or greater than p;

wherein the application of the time-staggered addresses results in fetching of m test patterns every time interval equal or greater than p, one test pattern at a time, at the DUT operating frequency.

18. A test apparatus for fetching test patterns from a pattern memory at an operating frequency of a device under test (DUT) which is higher than an operating frequency of the pattern memory, comprising:

a pattern memory organized into m modules, where m is an integer equal to or greater than a DUT/pattern memory speed ratio determined by dividing the DUT operating frequency by an operating frequency of the pattern memory, and rounding up to a higher integer if the ratio contains a fractional part, the m modules for storing n test patterns in a fixed repeating module order according to [n mod m], the storing of test patterns into any one module for each of the m modules following a fixed address sequence;

a plurality of address delay circuits, each address delay circuit coupled to a corresponding module via a portion of an address line unique to each of the m modules for delaying an address for the qth module by (q−1) delay units, where q varies from one to m and one delay unit represents approximately one DUT clock cycle; and a processor programmed for simultaneously applying identical addresses to the address delay circuits of the m modules according to the fixed address sequence at a rate f equal to or slower than the operating frequency of the pattern memory, such that a period of f is equal to or greater than (m−1) delay units;

wherein the address delay circuits cause the identical addresses to be applied to the address lines of the m modules in a time-staggered manner, resulting in fetching of m test patterns in each period of f, one test pattern at a time, at the DUT operating frequency.

19. The test apparatus as recited in claim 18, the processor further programmed for receiving a memory enable signal for defining a start and end of the test pattern fetching from the pattern memory.

20. The test apparatus as recited in claim 18, further including memory management configuration circuitry coupled to the processor and the pattern memory, the processor further programmed for configuring the memory management configuration circuitry in accordance with the DUT/pattern memory speed ratio to organize the pattern memory into m modules.

21. The test apparatus as recited in claim 18, further including memory management configuration circuitry coupled to the processor and the plurality of address delay circuits, the processor further programmed for configuring the memory management configuration circuitry in accordance with the DUT operating frequency to program a delay of (q−1) delay units into the address delay circuits of the address lines of the qth module.

22. The test apparatus as recited in claim 18, further comprising:

a plurality of clock delay circuits, each clock delay circuit coupled to a corresponding module via a portion of a clock line unique to each of the m modules for delaying a clock for the qth module by (q−1) delay units; and the processor further programmed for simultaneously applying an identical clock to the clock delay circuits of the m modules at the rate f;

wherein the clock delay circuits cause the identical clock to be applied to the clock lines of the m modules in a time-staggered manner.

23. The test apparatus as recited in claim 22, the processor further programmed for receiving a memory enable signal for defining a start and end of the test pattern fetching from the pattern memory.

24. The test apparatus as recited in claim 22, further including memory management configuration circuitry coupled to the processor and the pattern memory, the processor further programmed for configuring the memory management configuration circuitry in accordance with the DUT/pattern memory speed ratio to organize the pattern memory into m modules.

25. The test apparatus as recited in claim 22, the processor further programmed for configuring the memory management configuration circuitry in accordance with the DUT operating frequency for programming a delay of (q−1) delay units into the address and clock lines of the qth module.

26. A test apparatus for fetching test patterns from a pattern memory at an operating frequency of a device under test (DUT) which is higher than an operating frequency of the pattern memory, comprising:

a pattern memory organized into m modules, where m is an integer equal to or greater than a DUT/pattern memory speed ratio determined by dividing the DUT operating frequency by an operating frequency of the pattern memory, and rounding up to a higher integer if the ratio contains a fractional part, the m modules for storing n test patterns in a fixed repeating module order according to [n mod m], the storing of test patterns into any one module for each of the m modules following a fixed address sequence;

a plurality of clock delay circuits, each clock delay circuit coupled to a corresponding module via a portion of a clock line unique to each of the m modules for delaying a clock for the qth module by (q−1) delay units, where q varies from one to m and one delay unit represents approximately one DUT clock cycle; and a processor programmed for simultaneously applying an identical clock to the clock delay circuits of the m modules at a rate f equal to or slower than the operating frequency of the pattern memory, such that a period of f is equal to or greater than (m−1) delay units;

wherein the clock delay circuits cause the identical clock to be applied to the clock lines of the m modules in a time-staggered manner, resulting in fetching of m test patterns in each period of f, one test pattern at a time, at the DUT operating frequency.

27. The test apparatus as recited in claim 26, the processor further programmed for receiving a memory enable signal for defining a start and end of the test pattern fetching from the pattern memory.

28. The test apparatus as recited in claim 26, further including memory management configuration circuitry coupled to the processor and the pattern memory, the processor further programmed for configuring the memory management configuration circuitry in accordance with the DUT/pattern memory speed ratio to organize the pattern memory into m modules.

29. The test apparatus as recited in claim 26, the processor further programmed for configuring the memory management configuration circuitry in accordance with the DUT operating frequency for programming a delay of (q–1) delay units into the clock line of the qth module.

30. A test apparatus for fetching test patterns from a pattern memory at an operating frequency of a device under test (DUT) which is higher than an operating frequency of the pattern memory, comprising:

a pattern memory organized into m modules, where m is an integer equal to or greater than a DUT/pattern memory speed ratio determined by dividing the DUT operating frequency by an operating frequency of the pattern memory, and rounding up to a higher integer if the ratio contains a fractional part, the m modules for storing n test patterns in a fixed repeating module order according to [n mod m], the storing of test patterns into any one module for each of the m modules following a fixed address sequence;

a plurality of output delay circuits, each output delay circuit coupled to a corresponding module via output lines unique to each of the m modules for delaying an output for the qth module by (q–1) delay units, where q varies from one to m and one delay unit represents approximately one DUT clock cycle; and a processor programmed for simultaneously applying identical addresses to address inputs of the m modules according to the fixed address sequence at a rate f equal to or slower than the operating frequency of the pattern memory, such that a period of f is equal to or greater than (m–1) delay units;

wherein the output delay circuits cause test patterns to become available in a time-staggered manner, resulting in fetching of m test patterns in each period of f, one test pattern at a time, at the DUT operating frequency.

31. The test apparatus as recited in claim 30, the processor further programmed for receiving a memory enable signal for defining a start and end of the test pattern fetching from the pattern memory.

32. The test apparatus as recited in claim 30, further including memory management configuration circuitry coupled to the processor and the pattern memory, the processor further programmed for configuring the memory management configuration circuitry in accordance with the DUT/pattern memory speed ratio to organize the pattern memory into m modules.

33. The test apparatus as recited in claim 30, the processor further programmed for configuring the memory management configuration circuitry in accordance with the DUT operating frequency for programming a delay of (q–1) delay units into the output lines of the qth module.

* * * * *